(12) United States Patent
Haneda

(10) Patent No.: US 10,746,808 B2
(45) Date of Patent: Aug. 18, 2020

(54) ELECTRIC LEAKAGE DETECTION DEVICE

(71) Applicant: NTN CORPORATION, Osaka-shi, Osaka (JP)

(72) Inventor: Masaji Haneda, Omihachiman (JP)

(73) Assignee: NTN CORPORATION, Osaka (JP)

(*) Notice: Subject to any disclaimer, the term of this patent is extended or adjusted under 35 U.S.C. 154(b) by 53 days.

(21) Appl. No.: 16/086,237

(22) PCT Filed: Mar. 9, 2017

(86) PCT No.: PCT/JP2017/009474
§ 371 (c)(1),
(2) Date: Sep. 18, 2018

(87) PCT Pub. No.: WO2017/159535
PCT Pub. Date: Sep. 21, 2017

(65) Prior Publication Data
US 2019/0162770 A1 May 30, 2019

(30) Foreign Application Priority Data
Mar. 18, 2016 (JP) .................. 2016-055920

(51) Int. Cl.
*G01R 31/50* (2020.01)
*H02H 3/16* (2006.01)

(52) U.S. Cl.
CPC ............ *G01R 31/50* (2020.01); *H02H 3/16* (2013.01)

(58) Field of Classification Search
CPC ........... G01R 31/50; G01R 31/02; H02H 3/16
USPC ................................. 324/509, 541
See application file for complete search history.

(56) References Cited

U.S. PATENT DOCUMENTS

| | | | | |
|---|---|---|---|---|
| 3,848,159 A | * | 11/1974 | Nye, Jr. ................. | H02H 1/06 361/45 |
| 3,978,400 A | * | 8/1976 | Pettit .................... | G01R 15/185 324/509 |
| 6,833,708 B2 | | 12/2004 | Furukawa | |
| 7,623,329 B2 | * | 11/2009 | Williams ............... | H01H 83/02 361/42 |
| 7,791,850 B2 | * | 9/2010 | Chen ..................... | H02H 3/334 361/42 |
| 8,064,174 B2 | * | 11/2011 | Williams ............... | H01H 83/02 361/42 |
| 8,570,181 B2 | * | 10/2013 | Kinsel ................... | H02H 3/335 324/509 |
| 9,225,159 B2 | * | 12/2015 | Vangool ................ | H01H 83/04 |

(Continued)

FOREIGN PATENT DOCUMENTS

EP   3432011 A1 * 1/2019 ............ G01R 31/50
JP   S50-127630 Y   10/1975
(Continued)

OTHER PUBLICATIONS

Vishay Bccomponents, Varistors Introduction. www.vishay.com. Sep. 4, 2013. (Year: 2013).*

(Continued)

*Primary Examiner* — Hoai-An D. Nguyen
*Assistant Examiner* — Sean Curtis
(74) *Attorney, Agent, or Firm* — Kolitch Romano LLP

(57) ABSTRACT

An electric leakage detecting device using a middle point grounding method in which detection current flowing in the resistors as well as sensitivity for detecting current is kept low.

5 Claims, 4 Drawing Sheets

(56) References Cited

U.S. PATENT DOCUMENTS

| | | | |
|---|---|---|---|
| 9,322,867 B2* | 4/2016 | Chatroux | G01R 31/1272 |
| 9,385,489 B2* | 7/2016 | Wang | H01R 13/70 |
| 2007/0159740 A1* | 7/2007 | Williams | H01H 83/02 |
| | | | 361/42 |
| 2009/0180221 A1* | 7/2009 | Chen | H02H 3/334 |
| | | | 361/42 |
| 2011/0285399 A1* | 11/2011 | Ordones | H02J 3/36 |
| | | | 324/509 |
| 2012/0212864 A1* | 8/2012 | Elms | H01H 47/002 |
| | | | 361/49 |
| 2014/0098446 A1* | 4/2014 | Aromin | H02H 3/16 |
| | | | 361/42 |
| 2014/0103939 A1* | 4/2014 | Chatroux | G01R 27/18 |
| | | | 324/551 |
| 2015/0326003 A1* | 11/2015 | Yu | H02H 3/16 |
| | | | 361/42 |
| 2019/0162770 A1* | 5/2019 | Haneda | G01R 31/52 |
| 2019/0348216 A1* | 11/2019 | Kim | H01F 27/30 |

FOREIGN PATENT DOCUMENTS

| | | | | |
|---|---|---|---|---|
| JP | H05-275687 A | | 10/1993 | |
| JP | H11-88095 A | | 3/1999 | |
| JP | 2002-296316 A | | 10/2002 | |
| JP | 2009-261039 A | | 11/2009 | |
| JP | 2013-130536 A | | 7/2013 | |
| JP | 2014-522628 A | | 9/2014 | |
| JP | 2017172992 A | * | 9/2017 | G01R 31/52 |
| WO | WO-2012164073 A1 | * | 12/2012 | B60L 50/51 |

OTHER PUBLICATIONS

Japan Patent Office, International Search Report and Written Opinion of the International Searching Authority in PCT/JP2017/009474, dated May 23, 2017, which is the international application to this U.S. application.

* cited by examiner

ELECTRIC LEAKAGE DETECTION DEVICE

CROSS-REFERENCE TO RELATED APPLICATIONS

This application is a national phase application of PCT/JP2017/009474, filed Mar. 09, 2017, which claims priority to Japanese Application No. 2016/055920, filed Mar. 18, 2016, each of which is hereby incorporated by reference.

FIELD

The present invention relates to an electric leakage detecting device adapted for an alternating current (AC) power source or a direct current (DC) power source using a middle point grounding method.

BACKGROUND

The middle point grounding method is a conventionally know grounding method for grounding a system power supply, which is used not only in AC power sources but also in high voltage DC power sources.

Also known in connection with the middle point grounding method is an electric leakage detecting device in which voltage is divided by resistor. As examples of such known art, the prior art discloses using two voltage division resistors connected between a positive power line and a negative power line of a DC power source and grounding the middle point of the two resistors. The prior art discloses teaches detecting electric leakage by dividing each voltage division resistor on a positive and a negative side into two sub voltage division resistors and comparing potentials at the middle points of the sub voltage division resistors and a reference potential. The prior art discloses detecting electric leakage by monitoring end-to-end voltage of voltages of two division resistors and detecting change in voltage ratio or voltage difference of the two voltage division resistors.

A middle point grounding system with voltage division resistors is also advantageous in that, in the event of an electrical shock accident on its power lines, the electric current that flows in the subject is lowered as the voltage division resistors are positioned to be juxtaposed to the subject.

SUMMARY

In an electric leakage detecting device using a middle point grounding method, two resistors are disposed between two power lines in a serial alignment with their middle point being grounded and end-to-end voltage of the whole or part of each resistor is measured to detect electric leakage. This is equivalent to detecting electric current flowing in each resistor. As it is considered desirable that the electric currents flowing in the resistors are as low as possible, the resistance values of the resistors are set to be relatively high. In particular, when the power source has voltage of several hundreds of volts and the resistors have resistance values of tens of kilo-ohms, for example, sensitivity current will be several milliamperes in the event of electrical leakage such as ground fault. Measurement of current in such a high sensitivity area is prone to noise, causing malfunction to occur.

In case the resistance values of the resistors are set lower to make the sensitivity current larger and the device resistant to noise, bleeder current flowing in the resistors at a normal time becomes larger, consuming larger electric power.

In consideration of the above problems of the prior art, it is an object of the present invention to provide an electric leakage detecting device using a middle point grounding method in which breeder current flowing in the resistors at a normal time is kept lower and sensitivity current in the event of electrical leakage is made larger so as to make the device resistant to noise.

As a solution to the above-mentioned problems, the present invention has been accomplished, the details of which are described below. In the below description, the reference symbols in parentheses correspond to those shown in the drawings.

According to the present invention, there is provided an electric leakage detecting device which is connected between a pair of power lines (L1, L2) comprising a first resistor circuit (C1) having a first linear resistor device (R1) and a first constant voltage device (VR1) in serial connection with each other, said first constant voltage device (VR1) lowering its resistance value so as to maintain the end-to-end voltage thereof at a constant level when voltage exceeding a predetermined level is applied to said first resistor circuit (C1) and a second resistor circuit (C2) having a second linear resistor device (R2) and a second constant voltage device (VR2) in serial connection with each other, said second constant voltage device (VR2) lowering its resistance value so as to maintain the end-to-end voltage thereof at a constant level when voltage exceeding a predetermined level is applied to said second resistor circuit (C2) wherein said first resistor circuit (C1) and said second resistor circuit (C2) are connected between said pair of power lines (L1, L2) in a serial alignment and the connection point (N) between said first resistor circuit (C1) and said second resistor circuit (C2) is grounded.

Preferably, the input voltage control device according to the present invention system of the present invention is further characterized in that said first constant voltage device and said second constant voltage device are respectively composed of varistor elements.

Preferably, the input voltage control device according to the present invention system of the present invention is further characterized in that said first constant voltage device and said second constant voltage device are respectively composed of two serially-connected Zener diodes each having polarity opposite to the other.

Preferably, the input voltage control device according to the present invention system of the present invention is further characterized in that said first constant voltage device and said second constant voltage device are respectively composed of at least one Zener diode.

As described in the above, the electric leakage detecting device according to the present invention comprises two serially-connected resistor circuits each of which is composed of a linear resistor device and a constant voltage device which are serially connected to each other. As each of the resistor circuits has the constant voltage device, the voltage applied to each linear resistor device is lowered by the amount equivalent to the end-to-end voltage of the constant voltage device.

In normal-time power supply, the voltage applied to each linear resistor device is lower than that applied to a circuit not having a constant voltage device by the amount equivalent to the end-to-end voltage of each constant voltage device. This causes both the bleeder current and the resistance value of each linear resistor device to be lowered by the amount corresponding to the lowered voltage. This leads to an effect that, at a normal time, the power consumption by the linear resistor devices are lower than that by a circuit not having constant voltage device(s). The resistance value of each linear resistor device being lower, the sensitivity current is made higher than that of a circuit not having constant voltage device(s). This leads to an effect that, in the event of electrical leakage, the sensitivity is lowered and the influence of noise is reduced.

DETAILED DESCRIPTION

Described hereinafter with reference to the attached drawings are detailed embodiments of electric the leakage detecting device according to the present invention.

[1] Basic Configuration

Figure 1:
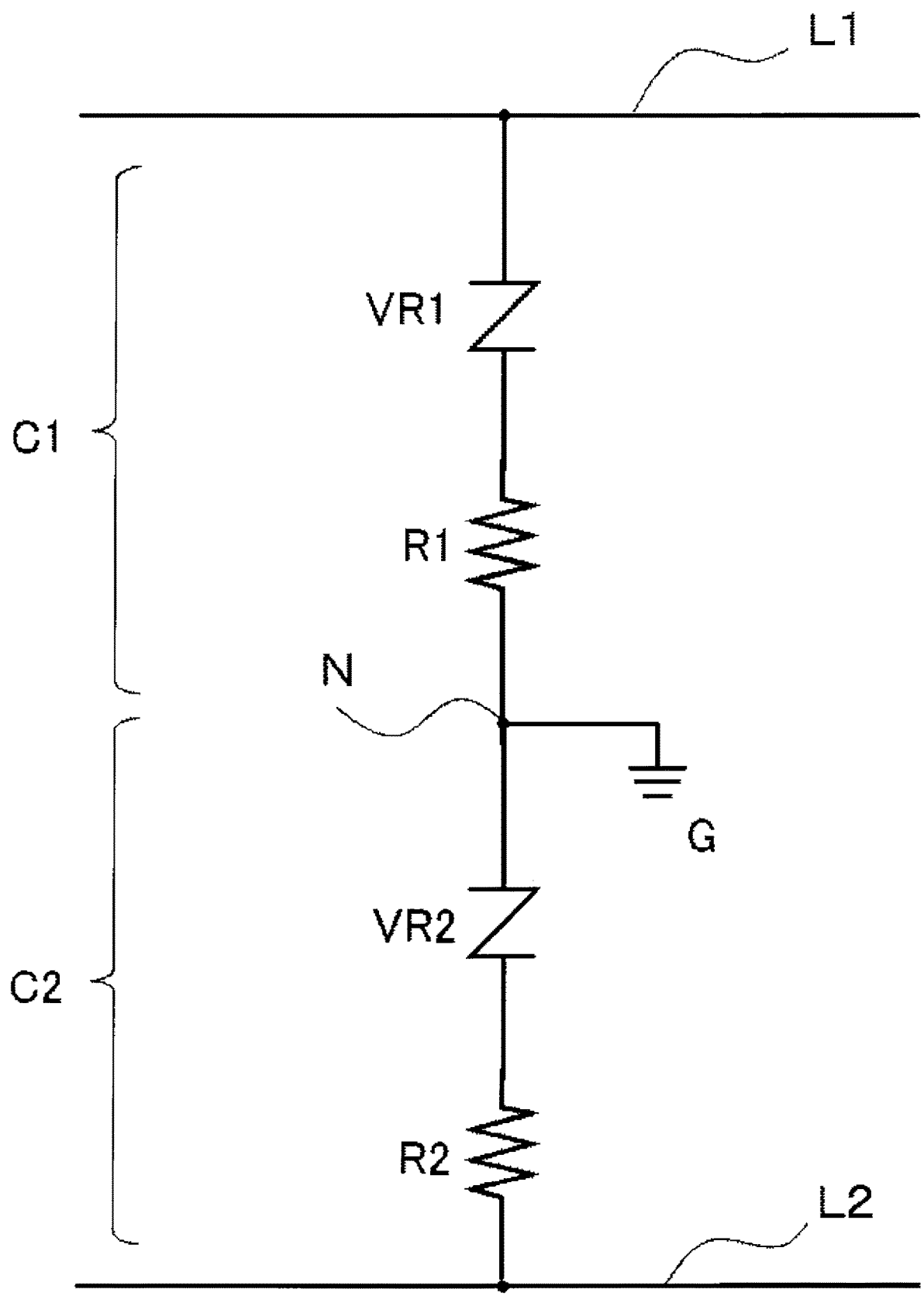
FIG. 1 is a view showing an exemplary basic configuration of an electric leakage detecting device according to an embodiment of the present invention.

FIG. 1 is a view showing an exemplary basic configuration of an electric leakage detecting device according to an embodiment of the present invention. The term "electric leakage detecting device" herein used means a circuit in which bleeder current flows at a normal time and sensitivity current flows in the event of electrical leakage. However, it does not mean a circuit such as an electric leakage circuit breaker, in which sensitivity current is used to determine occurrence of electric leakage or to determine to turn off power supply.

The electric leakage detecting device according to the present invention is connected between a pair of power lines L1 and L2, which is a system power supply (not shown in the figures) typically supplying alternating current (AC). In case three-phase AC is supplied, the electric leakage detecting devices are disposed between each pair of phases. In the present invention, not only AC but also DC can be supplied. In case AC is supplied, the power lines L1 and L2 may respectively be cathode and anode, or vice versa. For this reason, the electric leakage detecting device of the present invention is designed to be disposed in parallel with the power source.

In this embodiment, the electric leakage detecting device has a first resistor circuit C1 and a second resistor circuit C2 which are connected between the power lines L1 and L2 in a serial alignment. The first resistor circuit C1 has a varistor element VR1, which is a constant voltage device, and a resistor device R1 in serial connection with each other. The resistor device R1 is a linear resistor device. The second resistor circuit C2 has a varistor element VR2, which is a constant voltage device, and a resistor device R2 in serial connection with each other. The resistor device R2 is a linear resistor device. The connection point N between the first resistor circuit C1 and the second resistor circuit C2 is grounded.

It is a known art to ground the middle point of the power lines. Although it is preferable that the resistance values of the first resistor circuit C1 and the second resistor circuit C2 are equal, it is acceptable that the two have not very large difference in their resistance values. The same can be said regarding the relationship between the varistor elements VR1 and VR2 and between the resistor devices R1 and R2.

The varistor elements have a high resistance value when voltage not higher than a predetermined varister voltage is applied thereto and scarcely pass electric current therethrough. The varistor elements get to have a low resistance value when voltage higher than the varister voltage is applied thereto so as to maintain the end-to-end voltage thereof to be the varister voltage. The varistor elements work on electric current in both directions and withstand voltage of several hundred Volts and are adaptively used for high voltage DC power source.

[2] Operation

Figure 2:
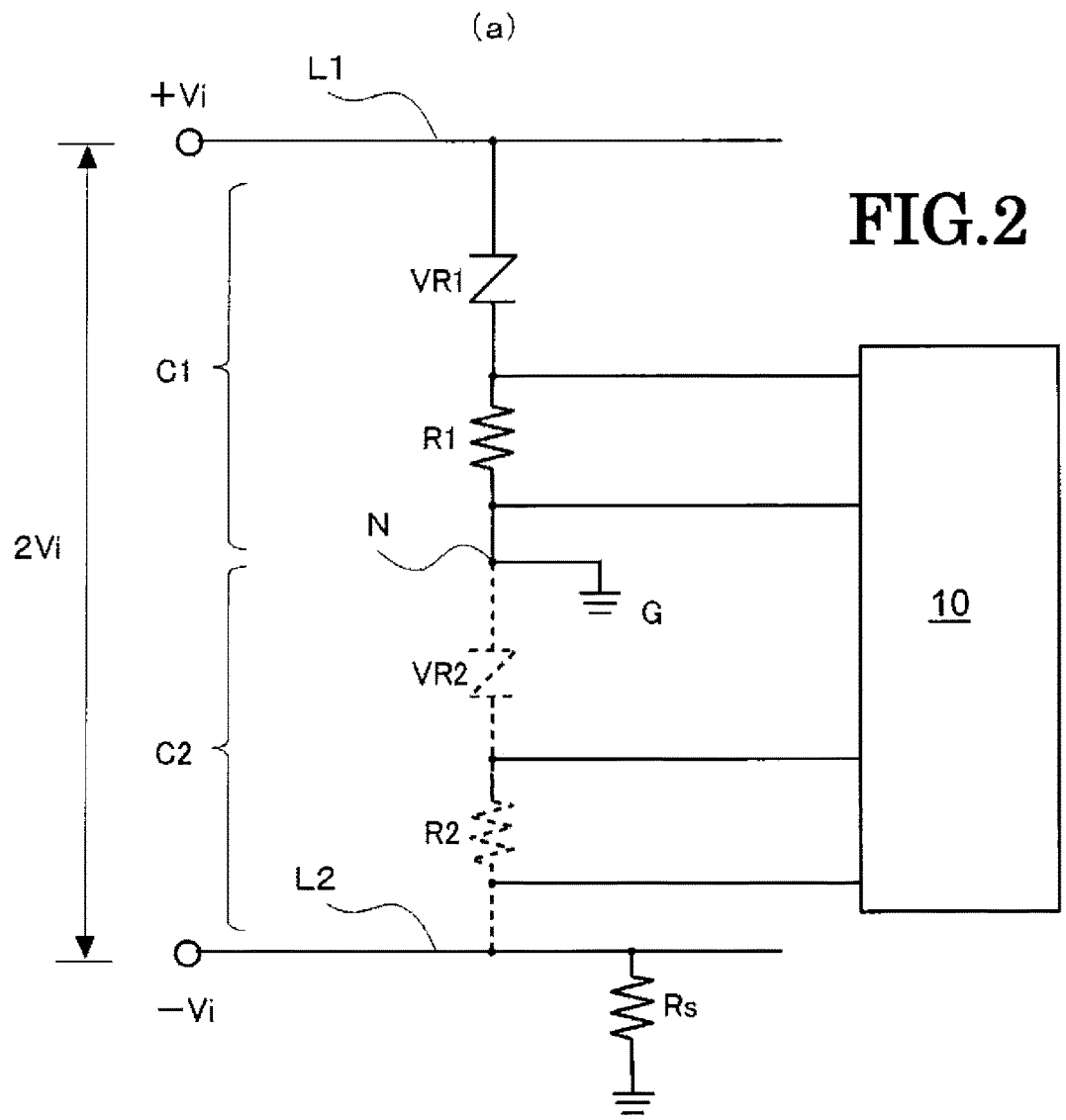
FIG. 2(a) is a view showing a situation that electric leakage has occurred on a power line in the electric leakage detecting device shown in FIG. 1.
FIG. 2(b) is a view showing an comparative example of an electric leakage detecting device.
Figure 2:
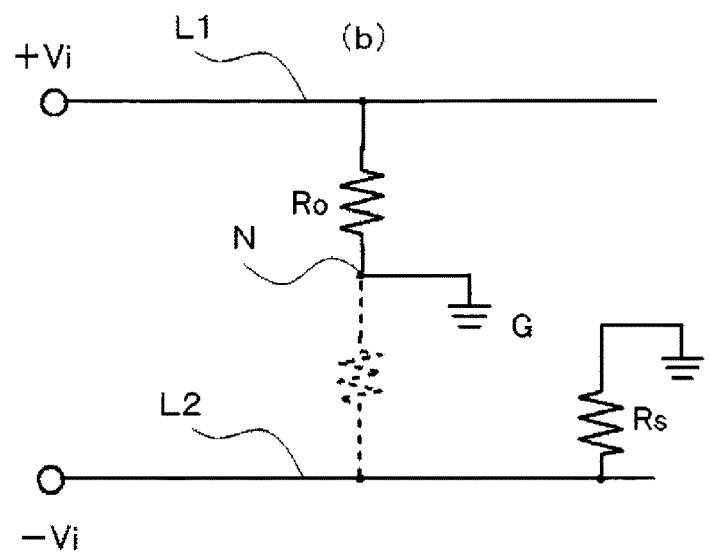
Figure 3:
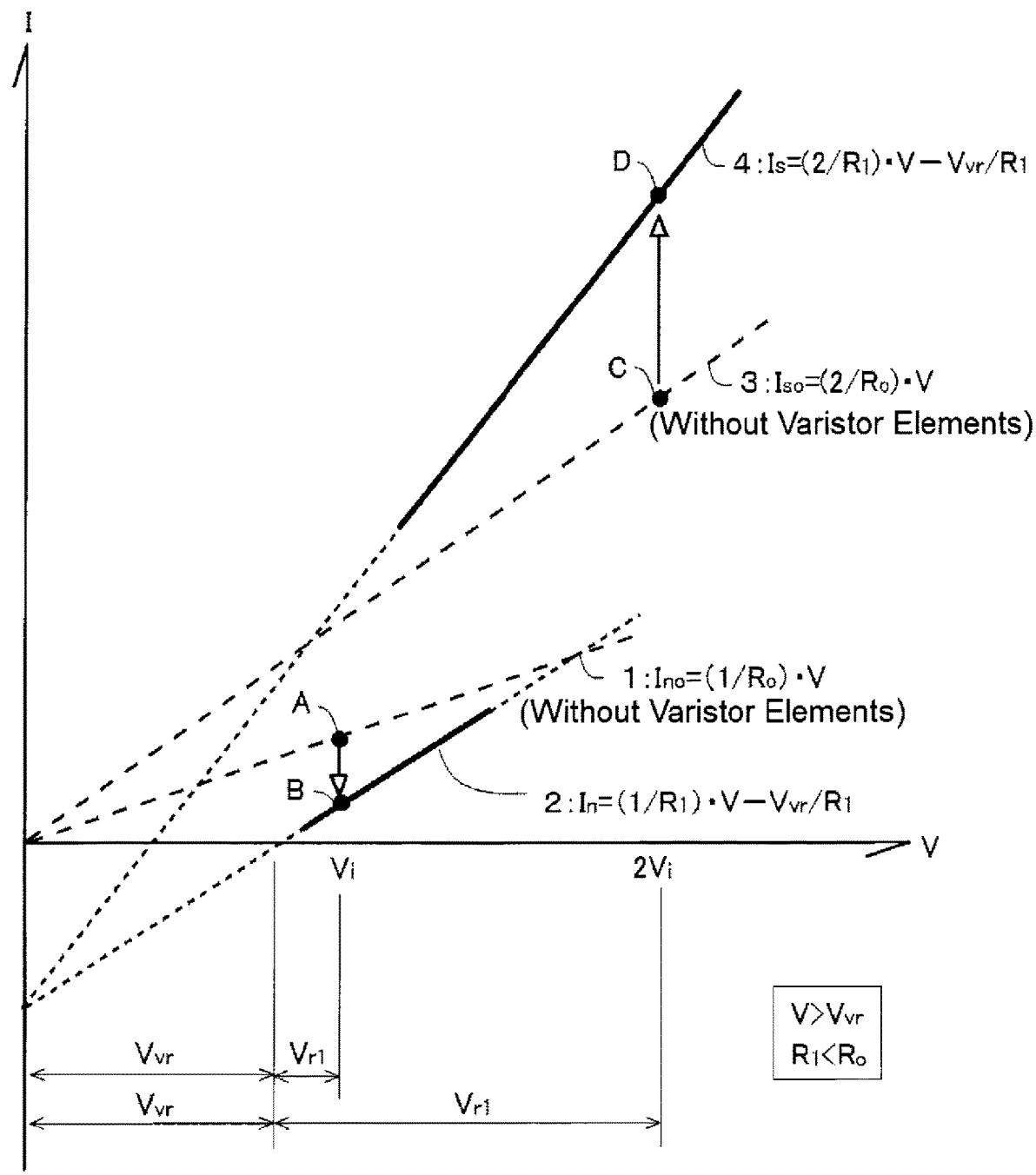
FIG. 3 is a characteristic diagram showing the V-I characteristics which indicate the relationships between the voltage V of the resistor device on one side and the current I respectively in the embodiment of FIG. 2(a) and the comparative example of FIG. 2(b), and respectively at a normal time and in the event of electrical leakage.

Below described with reference to FIG. 2 and FIG. 3 is operation of the electric leakage detecting device shown in FIG. 1.

Hereinafter, a situation is assumed that preset voltages higher than the varister voltages are respectively applied to the first resistor circuit C1 and the second resistor circuit C2 using an AC or DC power source. This means that between the power lines L1 and L2 is applied a preset voltage which is higher than the total voltage of the varister voltages of the two varistor elements. This situation can be made by selecting the varistor elements having appropriate varister voltages with respect to the voltage of the power source.

For ease of explanation, it is assumed, as an exemplary situation, that the varister voltages of the varistor elements VR1 and VR2 are equal and the resistance values of the resistor devices R1 and R2 are equal.

Shown in FIG. 2(a) is a situation in the electric leakage detecting device shown in FIG. 1 that the power lines L1 and L2 respectively have potentials of +Vi and −Vi. This means that the voltage between the power lines L1 and L2 is 2Vi. FIG. 2(a) is a view schematically showing a situation that electric leakage has occurred on a power line in the electric leakage detecting device shown in FIG. 1 (The dotted lines indicates the negative side of the circuit where electric leakage has occurred.). The point in which electric leakage has occurred is indicated as a ground fault resistor Rs, which is located between the power line L2 and the grounding point G. The ground fault resistor Rs has a resistance value which is substantially lower than the that of the first resistor circuit C1 and the second resistor circuit C2, or almost zero. For ease of explanation, it is hereinafter assumed that the resistance value of the ground fault resistor Rs is zero. Also shown in the figure is an electric leakage determining unit 10, which may be configured arbitrarily.

Now assuming a normal operating status where electric leakage does not occur, unlike the status shown in FIG. 2(a), the first resistor circuit C1 and the second resistor circuit C2 each has an end-to-end voltage of Vi, given the potentials +Vi and −Vi of the power lines L1 and L2 respectively.

FIG. 2 (b) is a view showing an comparative example of an electric leakage detecting device. In this comparative example, there is no varistor element between the power lines L1 and L2, but two linear resistor devices Ro are disposed in serial alignment with each other with the connecting point therebetween grounded. The linear resistor devices Ro each has an end-to-end voltage of Vi.

FIG. 3 is a characteristic diagram showing the V-I characteristics which indicate the relationships between the end-to-end voltage V of the resistor device on the positive side (i.e. the first resistor circuit C1) and the current I respectively in the embodiment of FIG. 2(a) and the comparative example of FIG. 2(b), and respectively at a normal time and in the event of electrical leakage.

<Bleeder Current at Normal Time>

At a normal time, the relationship between the end-to-end voltage V and the current $I_{no}$ of the resistor device on the positive side, which is composed of the linear resistor device Ro, in the comparative example is represented by the below formula.

$$I_{no}=(1/R_o) \times V \qquad (1)$$

$I_{no}$: current of resistor device Ro at normal time
$R_o$: resistance value of resistor device Ro The above formula (1) is expressed as a line 1 with an inclination of $1/R_o$ passing the origin in the graph representation of FIG. 3. When V=Vi, the current $I_{no}$ is expressed as a point A.

At a normal time, the relationship between the end-to-end voltage V and the current $I_n$ of the first resistor circuit C1, which is composed of the resistor device R1 and the varistor element VR1 in the embodiment is represented by the below formula.

$$I_n=(1/R_1) \times V - V_{Vr}/R_1 \qquad (2)$$

$I_n$: current of resistor device R1 at normal time
$R_1$: resistance value of resistor device R1
$V_{Vr}$: varistor voltage of varistor element VR1

The above formula (2) is expressed as a line 2 in the graph representation of FIG. 3.

Since the present invention provides an effect that the resistance value of the resistor device is made lower than that of the comparative example, the below relationship is assumed.

$$R_1 < R_o$$

This means that the inclination $1/R_1$ of the line 2 is larger than the inclination $1/R_o$ of the line 1 as shown in the figure. Since the line 2 has a constant term corresponding to the varistor voltage $V_{Vr}$, it does not pass the origin and has a negative Y-intersection. When V=Vi, the current $I_n$ is expressed as a point B.

As described in the above, the circuit of the embodiment become effective when the end-to-end voltage V of the first resistor circuit is higher than the varister voltage $V_{Vr}$ (V>$V_{Vr}$). Since the end-to-end voltage $V_{Vr}$ of the varister element VR1 is substantially constant regardless of change of the voltage V, the below relationship is assumed, defining the end-to-end voltage of the resistor device R1 as $V_{r1}$.

$$V_{r1}=V-V_{Vr}$$

At a normal time, assuming that the end-to-end voltage of the first resistor circuit C1 is Vi, the end-to-end voltage $V_{r1}$ of the resistor device R1 becomes Vi–$V_{Vr}$.

By comparing the points A and B respectively corresponding to the lines 1 and 2, it is clear that, in the embodiment, the current which flows through the first resistor circuit C1 at a normal time, which is the bleeder current, is lower than that in the comparative example (see the void arrow in the figure). Not only because the bleeder current is lowered but also the resistor device R1 has a lower resistance value than the resistor device Ro, the power consumption IR2 of caused by the bleeder current is substantially lower than that in the comparative example.

As an example, the parameters are assumed as in the below.

power source voltage 2Vi (Vi): 600V (300V)
varistor voltage $V_{Vr}$ of varistor element VR1: 200V
resistance value $R_1$ of resistor device R1: 10 kΩ
resistance value Ro of resistor device Ro: 20 kΩ

In this case, the bleeder currents $I_n$ and $I_{no}$ in the embodiment and the comparative example at a normal time are respectively 10 mA and 15 mA.

As it is clear from FIG. 3, it is only on the left side of the intersection of the lines 1 and 2 in the graph representation that the bleeder current $I_n$ in the embodiment becomes lower than the bleeder currents $I_{no}$ in the comparative example. Thus, the present device should be made to operate in this range by adaptively setting the varister voltage and the resistance value of the resistor device with respect to the voltage of the power source.

<Sensitivity Current at Time of Electric Leakage>

FIG. 2(a) shows a situation that electric leakage has occurred. Assuming that the end-to-end voltage of the second resistor circuit C2 has becomes zero, that of the first resistor circuit C1 becomes 2Vi. Similarly in the comparative example, the end-to-end voltage of the resistor device Ro on the positive side becomes 2Vi.

In the comparative example, the relationship between the end-to-end voltage V of the resistor device on the positive side (i.e. the first resistor circuit C1) and the current $I_{so}$ in the event of electrical leakage is represented by the below formula (3), which represents a line having a double inclination compared to the formula (1).

Similarly, in the embodiment, the relationship between the end-to-end voltage V and the current $I_s$ in the event of electrical leakage is represented by the below formula (4), which represents a line having a double inclination compared to the formula (2).

$$I_{so}=(2/R_o) \times V \qquad (3)$$

$I_{so}$: current of resistor device Ro in the event of electrical leakage
$R_o$: resistance value of resistor device Ro $$I_s=(2/R_1) \times V - V_{Vr}/R_1 \qquad (4)$$

$I_s$: current of resistor device R1 in the event of electrical leakage
$R_1$: resistance value of resistor device R1
$V_{Vr}$: varistor voltage of varistor element VR1

The above formula (3) is expressed as a line 3 in the graph representation of FIG. 3. When V=2Vi, the current $I_{so}$ is expressed as a point C. Similarly, the above formula (4) is expressed as a line 4 in the graph representation of FIG. 3. When V=2Vi, the current $I_s$ is expressed as a point D. Since the end-to-end voltage $V_{Vr}$ of the varister element VR1 is substantially constant even in the event of electrical leakage, the below relationship is assumed.

$$V_{r1}=2V-V_{Vr}$$

In the event of electrical leakage, assuming that the end-to-end voltage of the first resistor circuit C1 is 2Vi, the end-to-end voltage $V_{r1}$ of the resistor device R1 becomes 2Vi–$V_{Vr}$.

By comparing the points C and D respectively corresponding to the lines 3 and 4, it is clear that, in the embodiment, the current which flows through the first resistor circuit C1 in the event of electrical leakage, which is the sensitivity current, is higher than that in the comparative example (see the void arrow in the figure). Because the sensitivity current which flows through the resistor device R1 is made higher, the sensitivity for detecting electric leakage is lowered and the influence of noise is reduced.

As an example, the same parameters are assumed as those at a normal time as described in the above. In this case, the sensitivity currents $I_s$ and $I_{so}$ in the embodiment and the comparative example at a normal time are respectively 40 mA and 30 mA.

As it is clear from FIG. 3, it is only on the right side of the intersection of the lines 3 and 4 in the graph representation that the sensitivity current $I_s$ in the embodiment becomes higher than the sensitivity currents $I_{so}$ in the comparative example. Thus, the present device should be made to operate in this range by adaptively setting the varistor voltage and the resistance value of the resistor device with respect to the voltage of the power source.

As described in the above, the electric leakage detecting device of the present invention having the interposing varistor elements VR1 and VR2 in serial alignment is capable of lowering the resistance values of the resistor devices R1 and R2 and yet lowering the bleeder current at a normal time compared to the device of the comparative example not having varistor elements. The electric leakage detecting device of the present invention is also capable of lowering the sensitivity current in the event of electrical leakage as the resistance values of the resistor devices R1 and R2 is low.

[3] Another Embodiment

Figure 4:
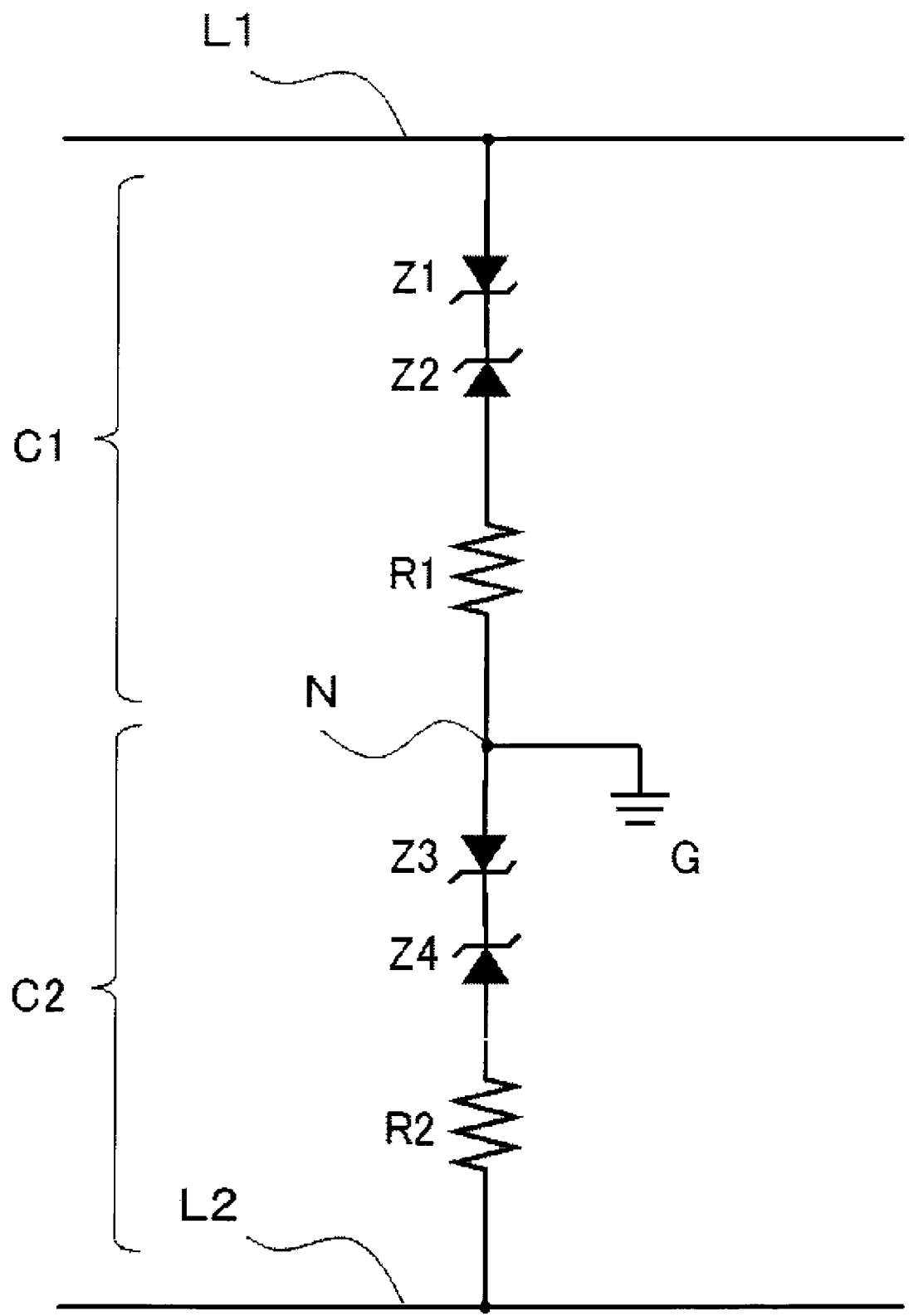
FIG. 4 is a view showing another configuration of an electric leakage detecting device according to an embodiment of the present invention.

FIG. 4 is a view showing another configuration of an electric leakage detecting device according to an embodiment of the present invention.

In the configuration of FIG. 4, the varistor elements of the first resistor circuit in the configuration of FIG. 1 are replaced with a pair of Zener diodes Z1 and Z2, and the varistor elements of the second resistor circuit in the configuration of FIG. 1 are replaced with a pair of Zener diodes Z3 and Z4. The Zener diodes in each pair are serially connected and each has polarity opposite to the other so as to be adapted for AC power sources. In case a DC power source is used, each pair of Zener diodes can be replaced with one Zener diode having polarity opposite to the voltage of the power source. Zener diodes are preferably used in case the voltage of the power source is relatively low.

In the above-described embodiments of the present invention, various modifications and combinations may be made for convenience of design and other reasons within the scope of the claimed inventions or the inventions described herein.

REFERENCE NUMERALS

VR1,VR2 constant voltage device (varistor element)
Z1,Z2,Z3,Z4 constant voltage device (Zener diode)
R1,R2 linear resistor device
C1,C2 resistor circuit
L1,L2 power line
Rs ground fault resistor
G grounding point
10 electric leakage determining unit It is an object of the present invention to provide an electric leakage detection device using a middle point grounding method in which detection current flowing in the resistors as well as sensitivity for detecting current is kept low.

An electric leakage detecting device which is connected between a pair of power lines comprising a first resistor circuit having a first linear resistor device and a first constant voltage device in serial connection with each other, said first constant voltage device lowering its resistance value so as to maintain the end-to-end voltage thereof at a constant level when voltage exceeding a predetermined level is applied to said first resistor circuit and a second resistor circuit having a second linear resistor device and a second constant voltage device in serial connection with each other said second constant voltage device lowering its resistance value so as to maintain the end-to-end voltage thereof at a constant level when voltage exceeding a predetermined level is applied to said second resistor circuit wherein said first resistor circuit and said second resistor circuit are connected between said pair of power lines in a serial alignment and the connection point between said first resistor circuit and said second resistor circuit grounded.

What is claimed is:

1. An electric leakage detecting device which is connected between a pair of power lines (L1, L2) comprising:
    a first resistor circuit (C1) having a first linear resistor device (R1) and a first constant voltage device (VR1) serially connected to each other at a first electrical connection, the first constant voltage device (VR1) lowering its resistance value so as to maintain a first end-to-end voltage thereof at a constant level when voltage exceeding a predetermined level is applied to the first resistor circuit (C1), and wherein only the first linear resistor device and the first constant voltage device are connected to the first electrical connection; and
    a second resistor circuit (C2) having a second linear resistor device (R2) and a second constant voltage device (VR2) serially connected to each other at a second electrical connection, the second constant voltage device (VR2) lowering its resistance value so as to maintain a second end-to-end voltage thereof at a constant level when voltage exceeding a predetermined level is applied to the second resistor circuit (C2), and wherein only the second linear resistor device and the second constant voltage device are connected to the second electrical connection;
    wherein the first resistor circuit (C1) and the second resistor circuit (C2) are connected between the pair of power lines (L1, L2) in a serial alignment and a connection point (N) between the first resistor circuit (C1) and the second resistor circuit (C2) is grounded.

2. The electric leakage detecting device of claim 1, wherein the first constant voltage device and the second constant voltage device are respectively composed of varistor elements.

3. The electric leakage detecting device of claim 1, wherein the first constant voltage device and the second constant voltage device are respectively composed of two serially connected Zener diodes each having polarity opposite to the other.

4. The electric leakage detecting device of claim 1, wherein the first constant voltage device and the second constant voltage device are respectively composed of at least one Zener diode.

5. An electric leakage detecting device which is connected between a pair of power lines (L1, L2) comprising:
    a first resistor circuit (C1) having a first linear resistor device (R1) and a first constant voltage device (VR1) serially connected to each other at a first electrical connection, the first constant voltage device (VR1) lowering its resistance value so as to maintain a first end-to-end voltage thereof at a constant level when voltage exceeding a predetermined level is applied to the first resistor circuit (C1), and wherein only the first linear resistor device and the first constant voltage device are connected to the first electrical connection; and a second resistor circuit (C2) having a second linear resistor device (R2) and a second constant voltage device (VR2) serially connected to each other at a second electrical connection, the second constant voltage device (VR2) lowering its resistance value so as to maintain a second end-to-end voltage thereof at a constant level when voltage exceeding a predetermined level is applied to the second resistor circuit (C2), and wherein only the second linear resistor device and the second constant voltage device are connected to the second electrical connection;

wherein the first resistor circuit (C1) and the second resistor circuit (C2) are connected between the pair of power lines (L1, L2) in a serial alignment and a connection point (N) between the first resistor circuit (C1) and the second resistor circuit (C2) is grounded; and wherein the first constant voltage device and the second constant voltage device are respectively composed of two serially connected Zener diodes each having polarity opposite to the other.

* * * * *